(12) United States Patent
Chen et al.

(10) Patent No.: US 7,179,991 B2
(45) Date of Patent: Feb. 20, 2007

(54) CASE OF ELECTRONIC DEVICE AND METHOD FOR FABRICATING THE SAME

(75) Inventors: Yun-Lung Chen, Tu-Cheng (TW); Yi-Chung Hsiao, Tu-Cheng (TW)

(73) Assignee: Hon Hai Precision Industry Co., Ltd. (TW)

( * ) Notice: Subject to any disclaimer, the term of this patent is extended or adjusted under 35 U.S.C. 154(b) by 0 days.

(21) Appl. No.: 11/244,917

(22) Filed: Oct. 5, 2005

(65) Prior Publication Data

US 2006/0151193 A1   Jul. 13, 2006

(30) Foreign Application Priority Data

Jan. 7, 2005   (CN)   ......................... 2005 2 0053632

(51) Int. Cl.
*H05K 5/00*   (2006.01)
(52) U.S. Cl. ..................... 174/50; 174/521; 174/66; 361/600; 361/683
(58) Field of Classification Search ............ 174/50, 174/53, 52.1, 58, 57, 66, 67, 520, 17 R; 220/3.2, 220/3.3, 3.8, 4.02, 241, 242; 361/600, 641, 361/667, 724, 725, 726, 730, 735, 752, 683, 361/679; 439/135, 136, 607, 731, 696, 682, 439/137, 138
See application file for complete search history.

(56) References Cited

U.S. PATENT DOCUMENTS

| | | | | |
|---|---|---|---|---|
| 6,058,018 | A  * | 5/2000  | Gerrits et al. | 361/752 |
| 6,146,193 | A  * | 11/2000 | Yu | 439/607 |
| 6,194,653 | B1 * | 2/2001  | McMiller et al. | 361/752 |
| 6,304,438 | B1   | 10/2001 | Liu et al. | |
| 6,394,843 | B1 * | 5/2002  | Chang et al. | 439/607 |
| 6,478,630 | B1 * | 11/2002 | Hsu | 439/607 |
| 6,540,557 | B1 * | 4/2003  | Yu | 439/607 |
| 6,570,088 | B1 * | 5/2003  | Depp et al. | 174/50 |
| 6,632,097 | B2 * | 10/2003 | Chang | 439/607 |
| 6,798,652 | B2 * | 9/2004  | Wang et al. | 361/726 |
| 6,908,338 | B2 * | 6/2005  | Okamoto | 439/607 |
| 6,909,047 | B2 * | 6/2005  | Zhang | 174/50 |
| 6,976,860 | B1 * | 12/2005 | Su | 439/607 |

\* cited by examiner

*Primary Examiner*—Angel R. Estrada
(74) *Attorney, Agent, or Firm*—Morris Manning & Martin; Tim Tingkang Xia, Esq.

(57) ABSTRACT

A case of an electronic device includes a chassis (10) and a top plate (30). The top plate has a lip (32) extending therefrom. The chassis includes a side plate (14). A cutout (142) is defined in the side plate. A securing portion (148) protrudes from the side plate to hold the lip in the cutout.

15 Claims, 4 Drawing Sheets

CASE OF ELECTRONIC DEVICE AND METHOD FOR FABRICATING THE SAME

BACKGROUND OF THE INVENTION

1. Field of the Invention

The present invention relates to cases of electronic devices, and more particularly to a case of electronic device having a simple configuration.

2. Description of Background

A case of electronic device generally has a plurality of plates. The plates are often assembled together with conventional fasteners, such as screws, stakes, rivets, etc.

For example, a computer chassis includes a bottom panel having front and rear portions forming front and rear flanges. Two openings are defined in the bottom panel proximate each of the front and rear portions and two retaining tabs are formed on the front flange. A front panel has a lower portion positioned on the bottom panel and abutting against the front flange. The lower portion of the front panel forms two projections received in the openings of the front portion of the bottom panel, and defines two slots receiving the retaining tabs of the bottom panel therein thereby firmly retaining the front panel on the bottom panel. A rear panel has a lower portion positioned on and abutting against the rear flange. The lower portion of the rear panel forms two projections received in the openings of the rear portion of the bottom panel, for properly positioning the rear panel on the bottom panel. Holes are defined in each of the front and rear panels and are aligned with corresponding holes defined in the bottom panel for receiving fasteners, such as rivets, screws and stakes, to secure the front and rear panels to the bottom panel. However, such fasteners as described above increase the material, the cost and the manufacturing process of the computer chassis.

What is desired, therefore, is a case of electronic device which decreases the material, the cost and the manufacturing process thereof.

SUMMARY

A case of an electronic device includes a chassis and a top plate. The top plate has a lip extending therefrom. The chassis includes a side plate. A cutout is defined in the side plate. A securing portion protrudes from the side plate to hold the lip in the cutout.

Advantages and novel features of the present invention will be drawn from the following detailed description of preferred embodiment with attached drawings, in which:

DETAIL DESCRIPTION OF PREFERRED EMBODIMENT

Figure 1:
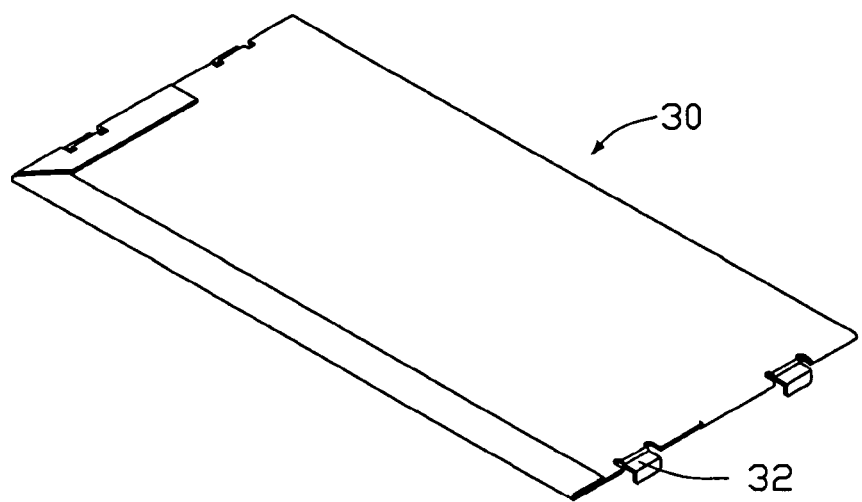
FIG. 1 is an exploded, isometric view of a case of an electronic device of a preferred embodiment of the present invention, the case including a chassis and a top plate.
Figure 1:
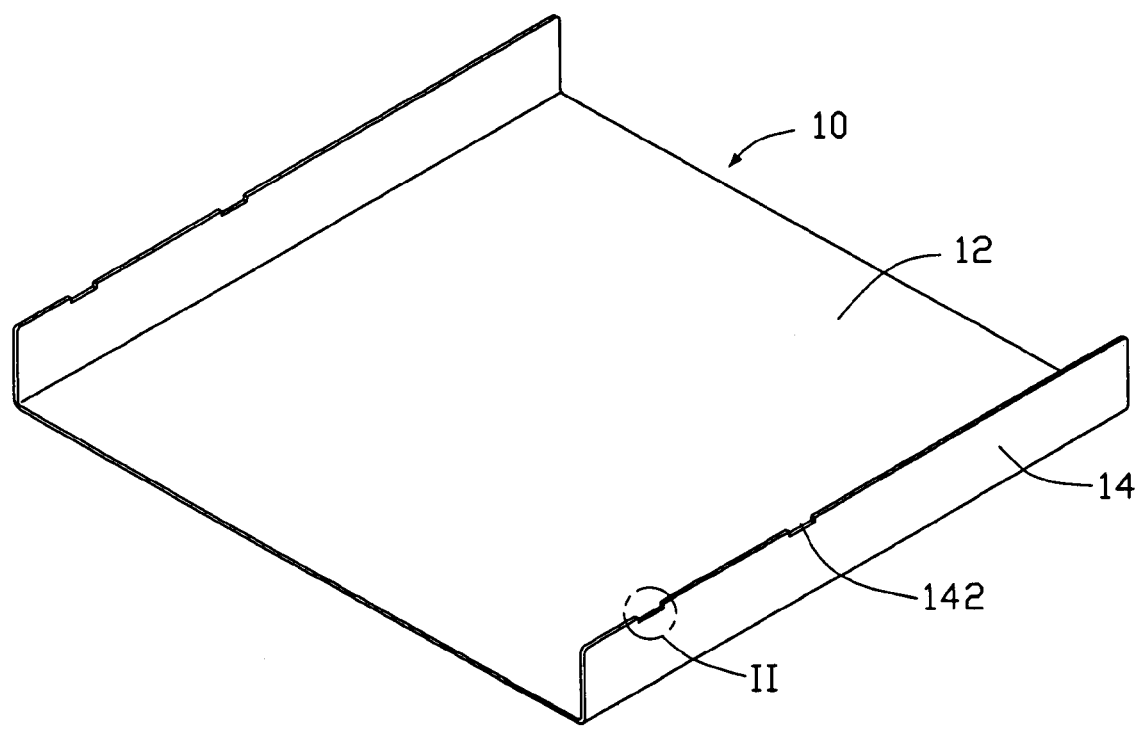
Figure 2:
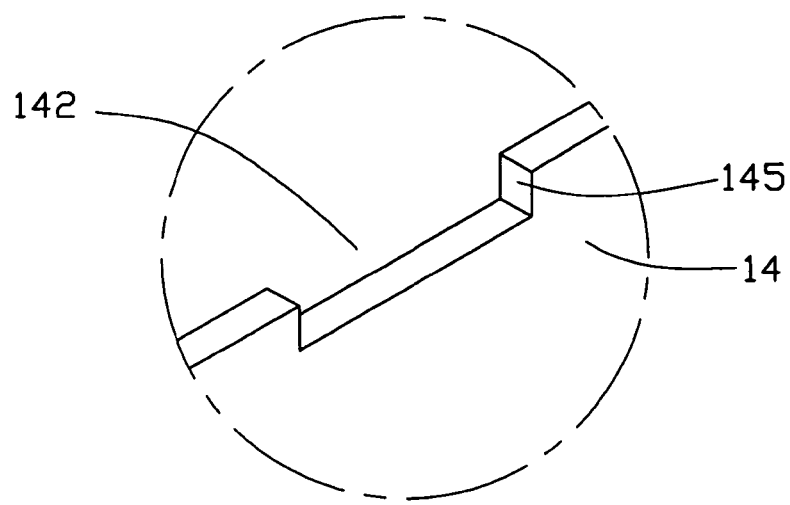
FIG. 2 is an enlarged view of circled portion II of FIG. 1.

Referring to FIGS. 1 and 2, a case of an electronic device in accordance with a preferred embodiment of the present invention includes a chassis 10 and a top plate 30.

The chassis 10 includes a bottom plate 12 and a pair of side plates 14 extending perpendicularly from opposite edges of the bottom plate 12. A pair of cutouts 142 is defined in each side plate 14. Each cutout 142 has a pair of sidewalls 145.

Figure 3:
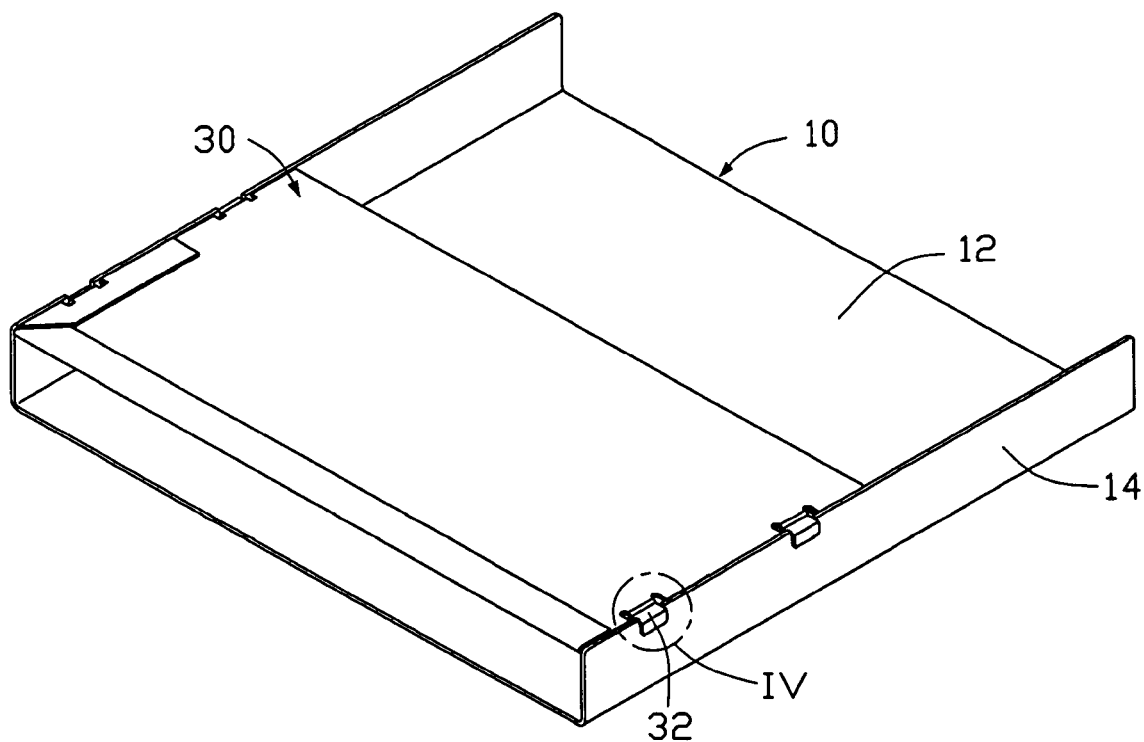
FIG. 3 is an pre-assembled view of FIG. 1.
Figure 4:
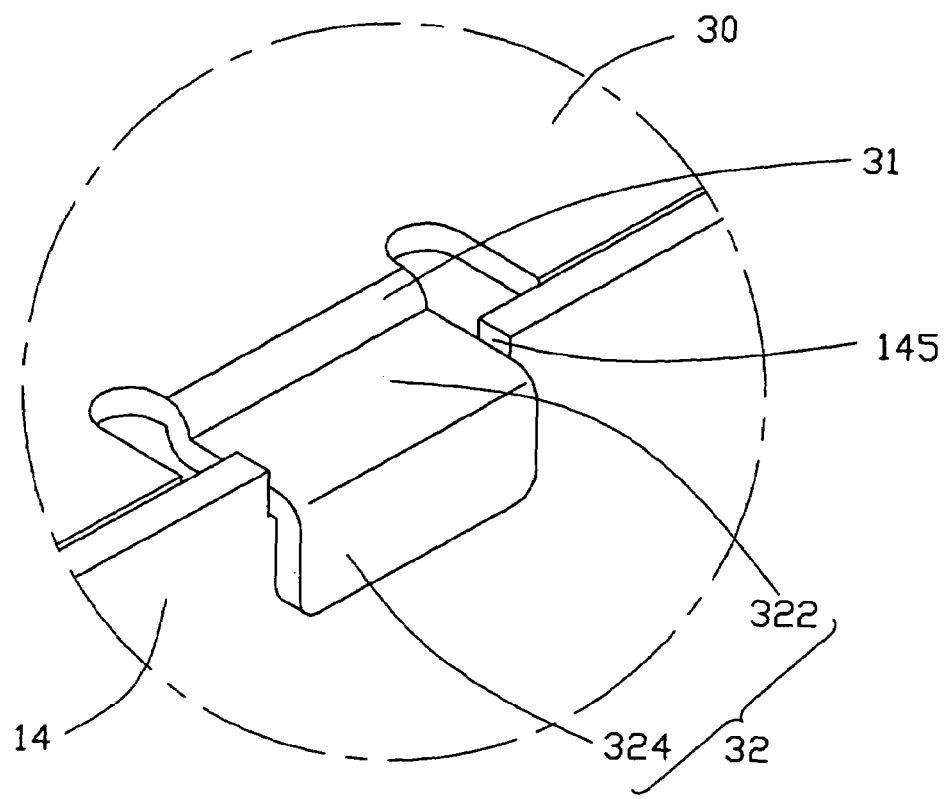
FIG. 4 is an enlarged view of circled portion IV of FIG. 3.

Referring also to FIGS. 3 and 4, a plurality of L-shaped lips 32 extends from opposite edges of the top plate 30. Each lip 32 includes a support portion 322 and a positioning portion 324 bent perpendicularly and downwardly from the support portion 322. The distance of the opposite edges of the top plate is equal to that of the opposite inner surfaces of the side plates 14 of the chassis 10. The distance of the opposite inner surfaces of the opposite positioning portions 324 of the lips 32 is equal to the outer surfaces of the opposite side plates 14 of the chassis 10.

In assembly, the top plate 30 is placed on the side plates 14 of the chassis 10. The support portions 322 of the lips 32 of the top plate 30 are situated in corresponding cutouts 142 of the side plates 14 respectively. The opposite edges of the top plate 30 abut against the opposite inner surfaces of the side plates 14 of the chassis 10 respectively. The positioning portions 324 of the lips 32 of the top plate 30 abut against the outer surfaces of the side plates 14 of the chassis 10 respectively.

Figure 5:
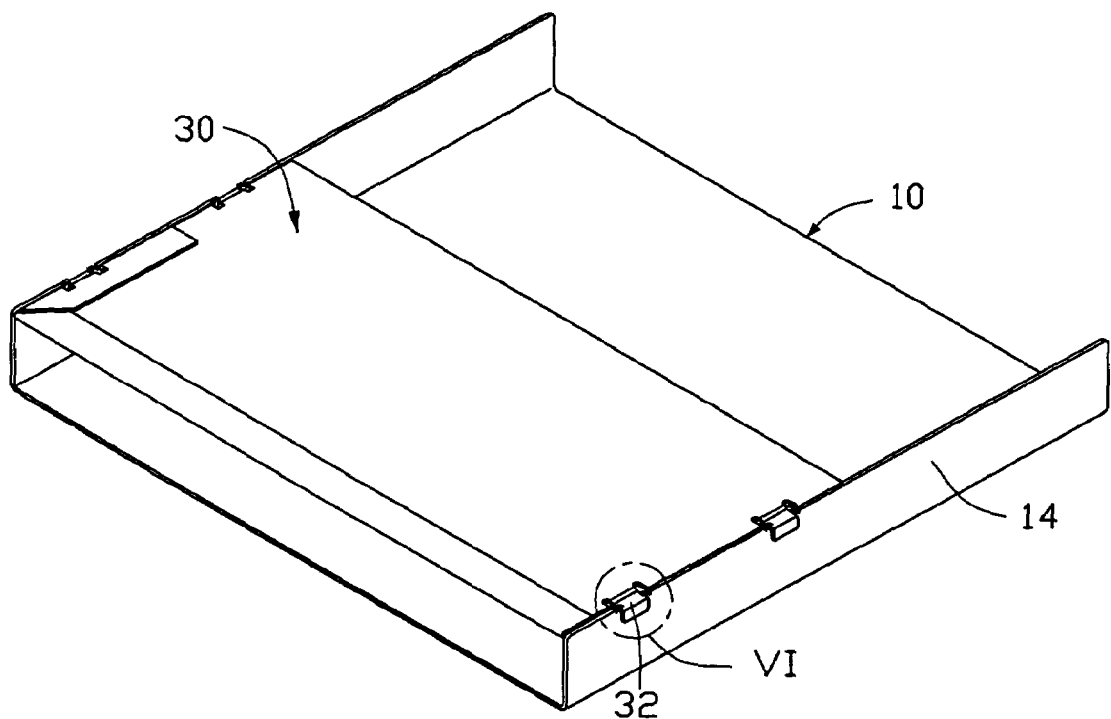
FIG. 5 is an assembled view of FIG. 1.
Figure 6:
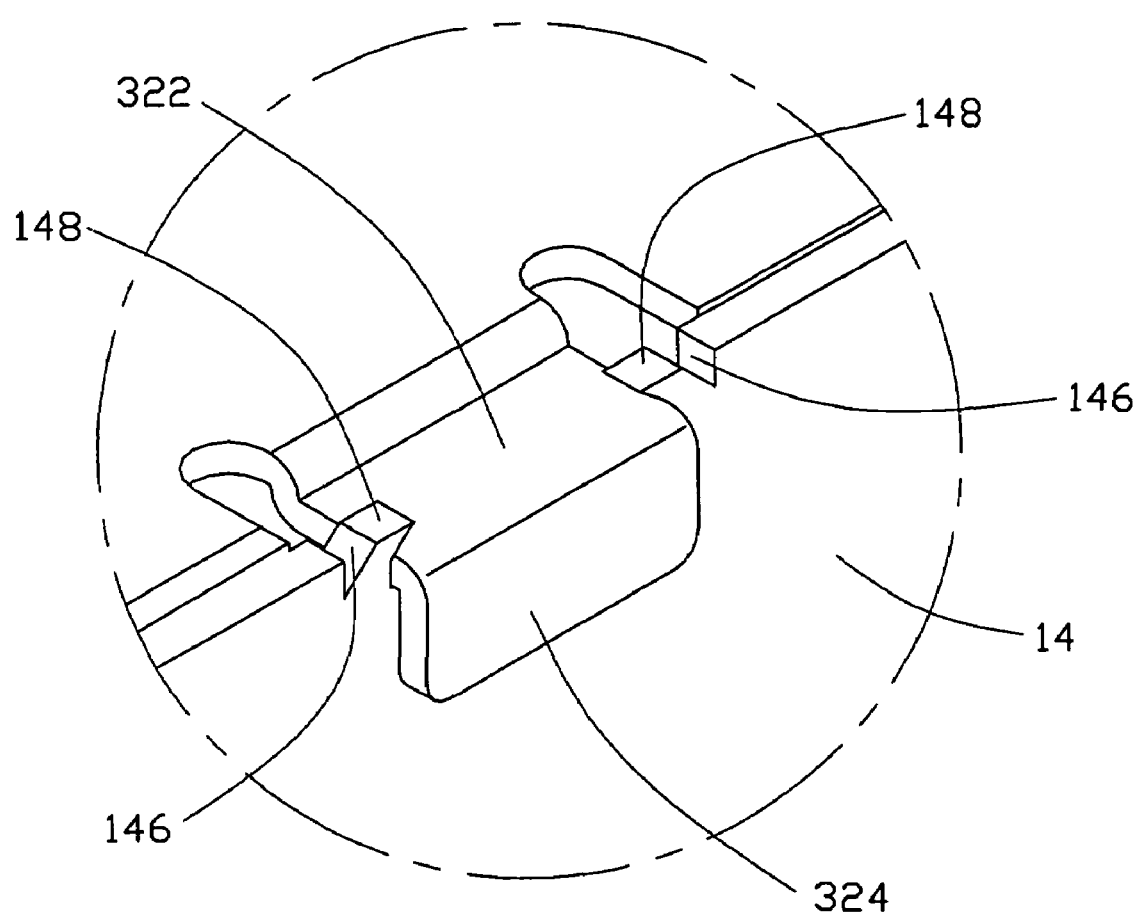
FIG. 6 is an enlarged view of circled portion VI of FIG. 5.

Referring also to FIGS. 5 and 6, for further assembling the top plate 30 to the chassis 10, a pair of generally V-shaped notches 146 is formed in both sides of each cutout 142 by cut-machining, thereby forming a pair of securing portions 148 respectively. Each pair of securing portions 148 deform towards each other to abut against the top surfaces of the corresponding support portions 322 of the lips 32, and thus rigidly catch the support portions 322 in the corresponding cutouts 142. The top plate 30 is thus firmly secured to the chassis 10. The assembly of the chassis 10 and the top plate 30 is completed.

It is also alternatively permitted that the distance of the opposite edges of the top plate 30 is slightly smaller that that of the opposite inner surfaces of the side plates 14 of the chassis 10.

It is also alternatively permitted that the distance of the opposite inner surfaces of the positioning portions 324 is slightly greater than that of the opposite outer surfaces of the side plates 14 of the chassis 10.

It is also alternatively permitted that each of the lips 32 can only have the support portion 322.

It is to be understood, however, that even though numerous characteristics and advantages have been set forth in the foregoing description of preferred embodiments, together with details of the structure and function, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A case of an electronic device comprising:
a top plate having a lip extending therefrom; and
a chassis comprising a side plate, a cutout being defined in the side plate for receiving the lip of the top plate, a securing portion protruding from the side plate and sandwiching the lip between the securing portion and a bottom edge of the cutout to block the lip sliding in the cutout.

2. The case as described in claim 1, wherein the lip comprises a support portion situated in the cutout.

3. The case as described in claim 2, wherein the securing portion abuts against a top surface of the support portion.

4. The case as described in claim 2, wherein the lip further comprises a positioning portion bent from the support portion for abutting against the side plate.

5. The case as described in claim 1, wherein the lip is L-shaped.

6. The case as described in claim 1, wherein a notch is defined adjacent to the cutout thereby forming the securing portion.

7. The case as described in claim 6, wherein the notch is V-shaped.

8. The case as described in claim 6, wherein the securing portion is positioned between the notch and the cutout.

9. A method for fabricating a case of an electronic device comprising:
 providing a chassis, the chassis comprising two side plates with at least one cutout defined therein;
 providing a top plate, the top plate having at least one lip extending therefrom;
 placing the top plate on the chassis to engage the at least one lip in the corresponding cutout of the side plates; and
 forming at least a pair of securing portions on the side plates after the at least one lip of the top plate is received into the corresponding cutout of the chassis, each pair of securing portions being deformed toward each other to abut against a top surface of the corresponding lip, thereby to hold the lip in the corresponding cutout.

10. The method as described in claim 9, wherein each of the at least one lip comprises a support portion situated in the cutout.

11. The method as described in claim 10, wherein the securing portion abuts against the top surface of the support portion.

12. The method as described in claim 10, wherein each of the at least one lip further comprises a positioning portion bent from the support portion for abutting against the side plates.

13. The method as described in claim 9, wherein two notches are defined adjacent to each of the at least one cutout of the side plate of the chassis thereby forming the securing portions.

14. The method as described in claim 13, wherein each notch is V-shaped.

15. The method as described in claim 13, wherein each of the securing portions is positioned between the corresponding notch and the corresponding cutout.

* * * * *